US011081577B2

United States Patent
(12) United States Patent
Kim et al.

(10) Patent No.: US 11,081,577 B2
(45) Date of Patent: Aug. 3, 2021

(54) ELECTRONIC DEVICE INCLUDING TWO-DIMENSIONAL ELECTRON GAS AND METHOD OF FABRICATING THE SAME

(71) Applicant: INDUSTRY-UNIVERSITY COOPERATION FOUNDATION HANYANG UNIVERSITY ERICA CAMPUS, Ansan-Si (KR)

(72) Inventors: Daehyun Kim, Ansan-si (KR); Taejoo Park, Ansan-si (KR); Yuhang Liu, Ansan-si (KR)

(73) Assignee: INDUSTRY-UNIVERSITY COOPERATION FOUNDATION HANYANG UNIVERSITY ERICA CAMPUS, Ansan-Si (KR)

(*) Notice: Subject to any disclaimer, the term of this patent is extended or adjusted under 35 U.S.C. 154(b) by 125 days.

(21) Appl. No.: 15/519,732

(22) PCT Filed: Sep. 24, 2015

(86) PCT No.: PCT/KR2015/010141

§ 371 (c)(1),
(2) Date: Apr. 17, 2017

(87) PCT Pub. No.: WO2016/060388

PCT Pub. Date: Apr. 21, 2016

(65) Prior Publication Data

US 2017/0243967 A1 Aug. 24, 2017

(30) Foreign Application Priority Data

Oct. 17, 2014 (KR) ........................ 10-2014-0140938

(51) Int. Cl.
*H01L 29/778* (2006.01)
*H01L 29/22* (2006.01)
(Continued)

(52) U.S. Cl.
CPC ...... *H01L 29/7786* (2013.01); *H01L 21/0262* (2013.01); *H01L 21/02554* (2013.01);
(Continued)

(58) Field of Classification Search
CPC ............. H01L 29/7786; H01L 29/7787; H01L 49/006; H01L 21/02178; H01L 21/022;
(Continued)

(56) References Cited

U.S. PATENT DOCUMENTS 7,432,526 B2 10/2008 Van de Walle
2005/0040481 A1* 2/2005 Shimizu ................ B82Y 10/00 257/411

(Continued)

FOREIGN PATENT DOCUMENTS

KR 1020130053576 5/2013
KR 1020130118095 10/2013

(Continued)

OTHER PUBLICATIONS

C H Ahn, K Senthil, H K Cho and S Y Lee; Scientific Reports; 3; 2737.*

(Continued)

*Primary Examiner* — Samuel A Gebremariam
*Assistant Examiner* — Jonas T Beardsley
(74) *Attorney, Agent, or Firm* — Finch & Maloney PLLC

(57) ABSTRACT

An electronic device including a two-dimensional electron gas is provided. The electronic device includes a substrate, a first material layer disposed on the substrate and formed of a binary oxide, a second material layer disposed on the first material layer and formed of a binary oxide, and a two-dimensional electron gas generated between the first material layer and the second material layer.

11 Claims, 7 Drawing Sheets

136
138
115
120
110
105
100

(51) Int. Cl.
*H01L 21/02* (2006.01)
*H01L 29/24* (2006.01)
*H01L 29/66* (2006.01)
*H01L 29/06* (2006.01)

(52) U.S. Cl.
CPC .... *H01L 21/02592* (2013.01); *H01L 29/2206* (2013.01); *H01L 29/247* (2013.01); *H01L 29/66969* (2013.01); *H01L 29/0657* (2013.01)

(58) Field of Classification Search
CPC ............. H01L 23/022; H01L 29/66462; G11C 2213/32
See application file for complete search history.

(56) References Cited

U.S. PATENT DOCUMENTS

| | | | | |
|---|---|---|---|---|
| 2005/0170667 | A1* | 8/2005 | Conley, Jr. | C23C 16/56 438/785 |
| 2006/0043504 | A1* | 3/2006 | Ahn | C23C 16/0281 257/410 |
| 2008/0087890 | A1* | 4/2008 | Ahn | H01L 21/31604 257/43 |
| 2008/0233762 | A1* | 9/2008 | Hong | C23C 16/405 438/763 |
| 2011/0065237 | A1* | 3/2011 | Bennahmias | C23C 16/0263 438/104 |
| 2012/0292584 | A1* | 11/2012 | Rocklein | H01L 45/08 257/2 |
| 2012/0309163 | A1* | 12/2012 | Kiyomura | H01L 28/91 438/396 |
| 2013/0264576 | A1* | 10/2013 | Onizawa | H01L 21/02345 257/76 |
| 2013/0264680 | A1* | 10/2013 | Auciello | B32B 7/02 257/532 |
| 2013/0277636 | A1 | 10/2013 | Lee | |
| 2014/0103283 | A1 | 4/2014 | Park | |
| 2014/0253183 | A1 | 9/2014 | Holmes | |
| 2016/0365133 | A1* | 12/2016 | Ino | G11C 11/2273 |

FOREIGN PATENT DOCUMENTS

| | | |
|---|---|---|
| KR | 101348937 | 1/2014 |
| KR | 1020140046809 | 4/2014 |
| KR | 1020140052162 | 5/2014 |
| KR | 101450093 | 10/2014 |

OTHER PUBLICATIONS

H-H Hsieh and C-C Wu; Applied Physics Letters; 91; 013502-1.*

Ahn ( C H Ahn, K Senthil, H K Cho and S Y Lee; Scientific Reports; 3; 2737).*

Hsieh (H-H Hsieh and C-C Wu; Applied Physics Letters; 91; 013502-1).*

In Situ Observation of Two-Dimensional Electron Gas Creation at the Interface of an Atomic Layer-Deposited Al2O3/TiO2 Thin-Film Heterostructure, T J Seok et al; Chem. Mater. 2020, 32, 7662-7669.*

* cited by examiner

【Fig. 1】
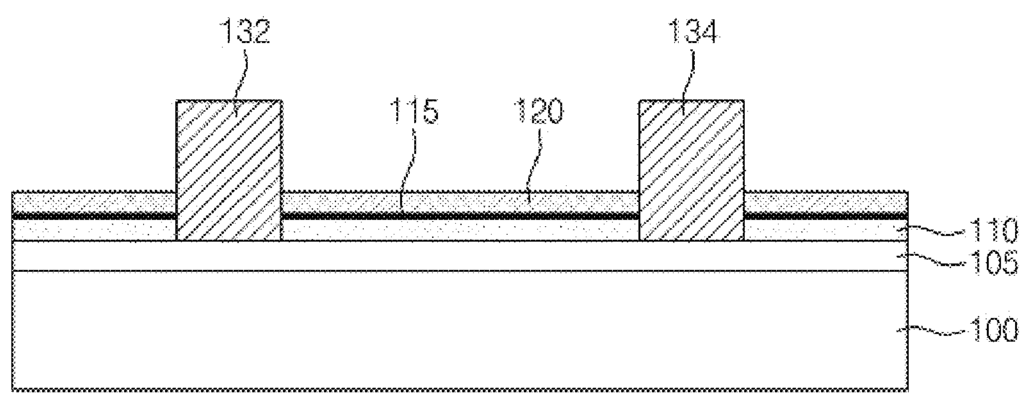

【Fig. 2】
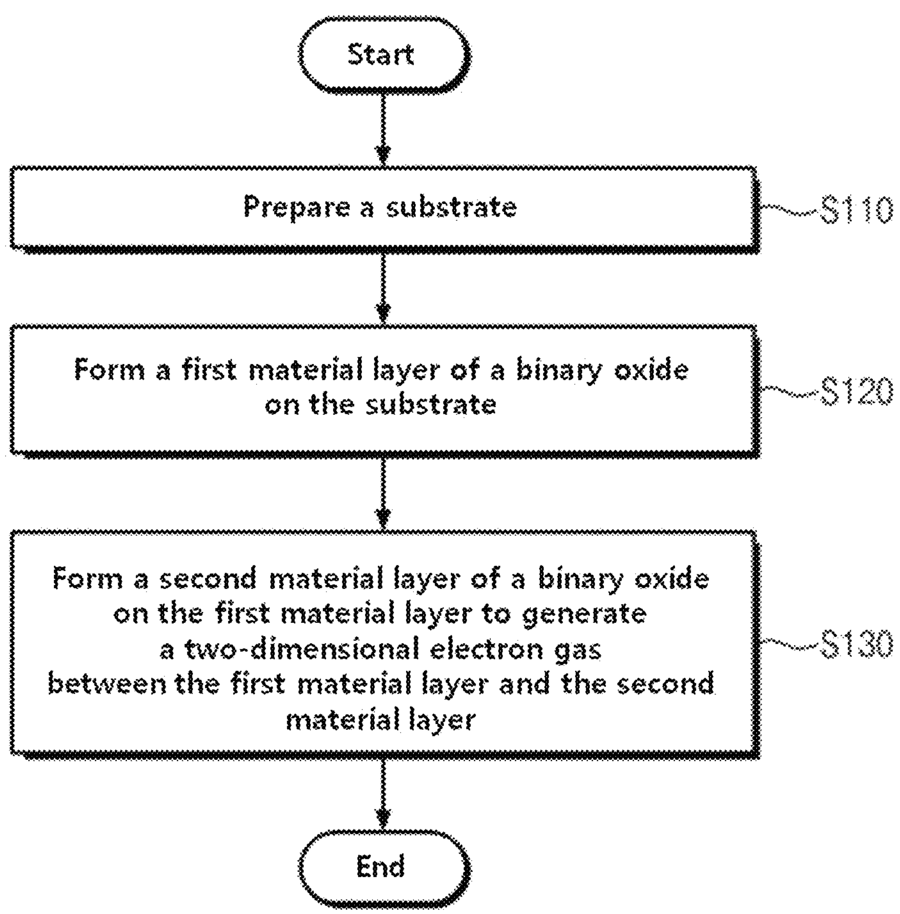

【Fig. 3】
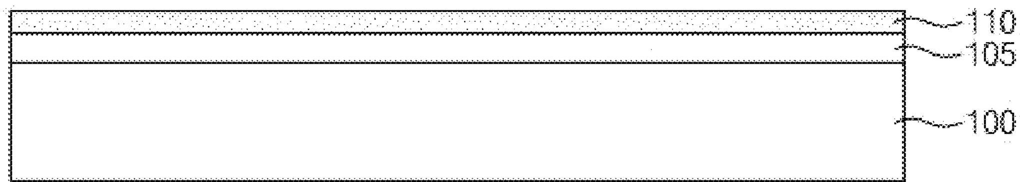
【Fig. 4】
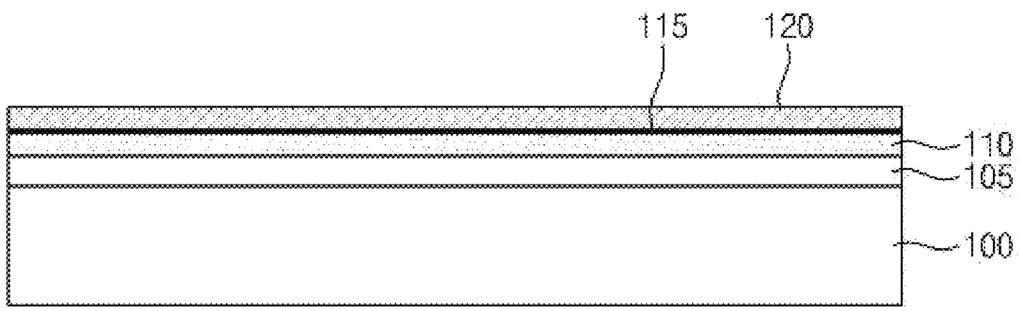
【Fig. 5】
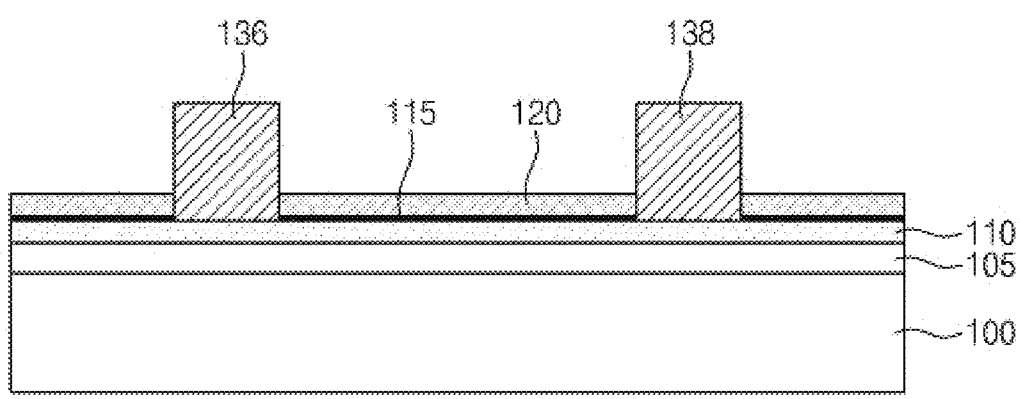

【Fig. 6】
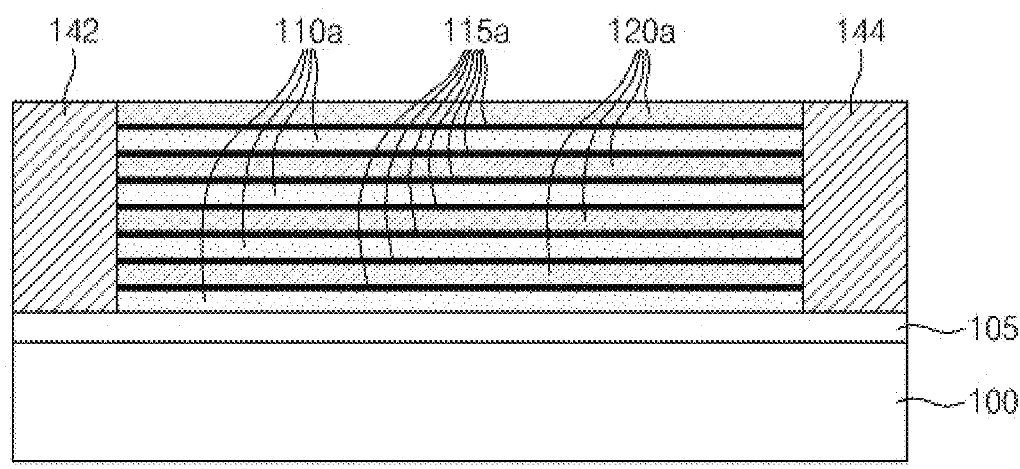
【Fig. 7】
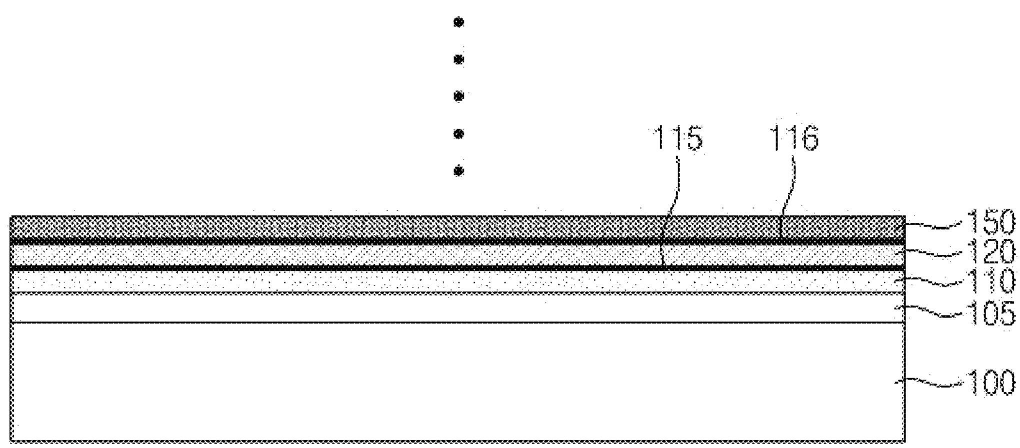

【Fig. 8】
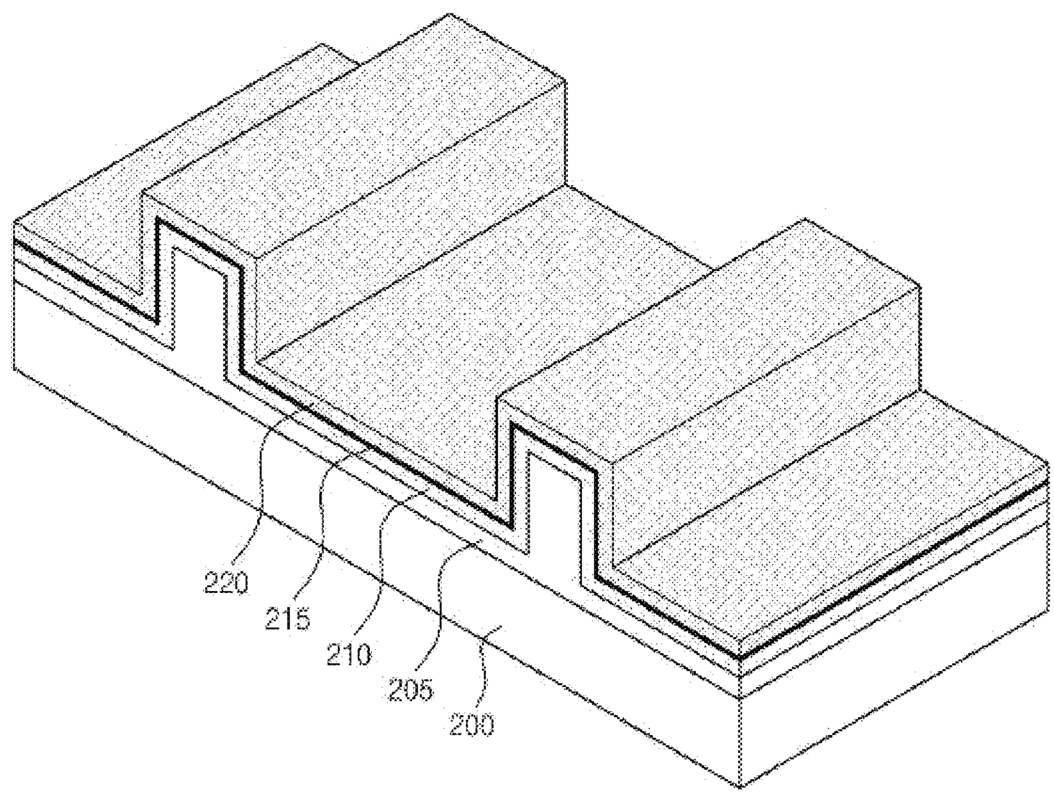
【Fig. 9】
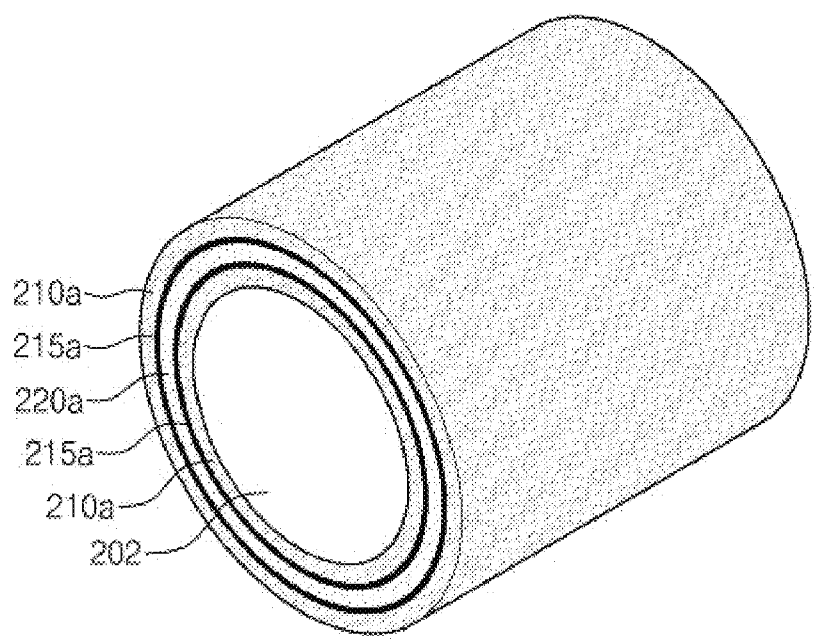

【Fig. 10】
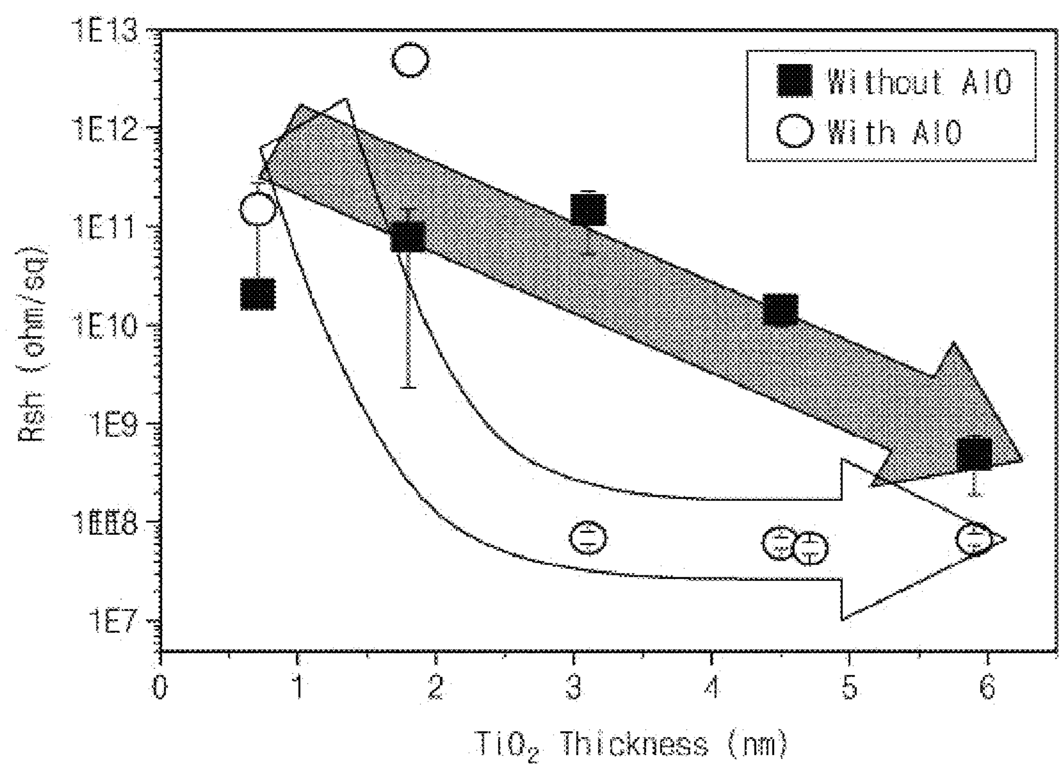

【Fig. 11】
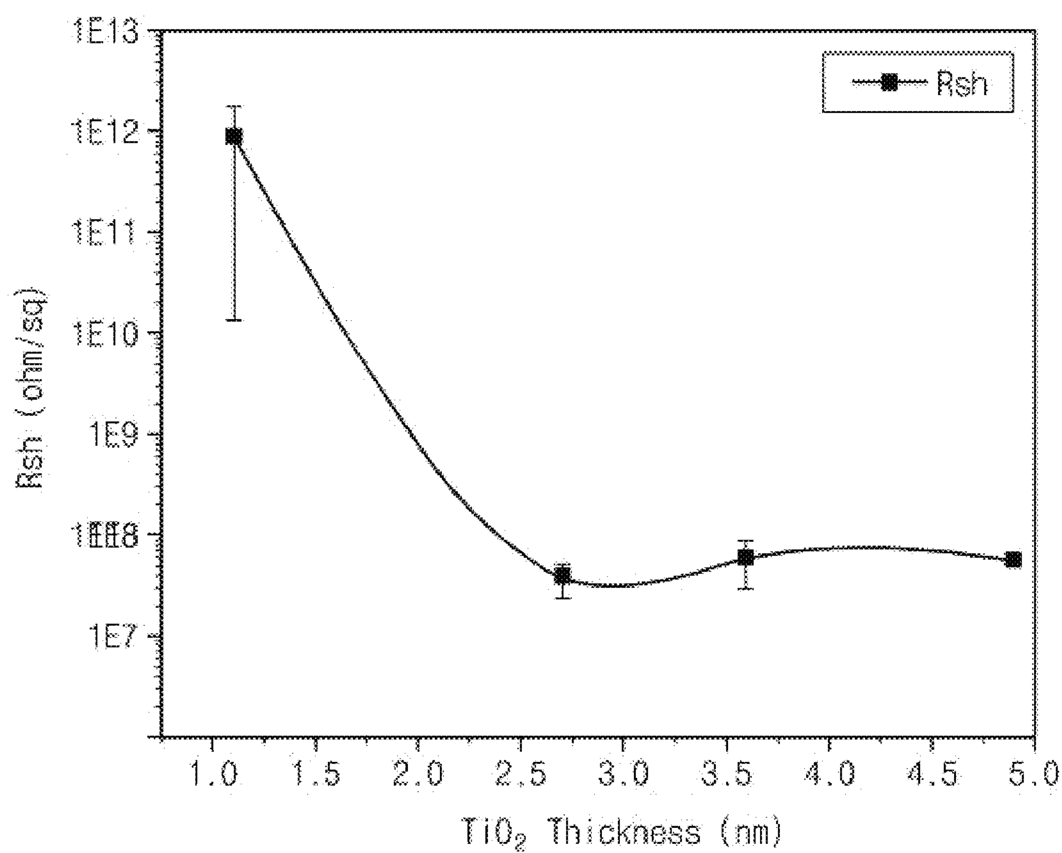

ELECTRONIC DEVICE INCLUDING TWO-DIMENSIONAL ELECTRON GAS AND METHOD OF FABRICATING THE SAME

THE NAMES OF THE PARTIES TO A JOINT RESEARCH AGREEMENT

This work was supported by the National Research Foundation of Korea grant funded by the Korean Ministry of Science, Research Program for SRC and ERC (Subject No. 2015R1A5A1037548) (100% Contribution). The name of the research subject is "Innovative Durable Building and Infrastructure Research Center", the managing department is HYU ERICA, and the research period is 1 Aug. 2015 through 28 Feb. 2025.

This work was supported by the Future Semiconductor Device Technology Development Program (Grant 10067739) funded by MOTIE (Ministry of Trade, Industry & Energy) and KSRC (Korea Semiconductor Research Consortium). This work was also supported by the National Research Foundation of Korea (NRF) grant funded by the Korean government (MSIT) (No. 2015R1A5A1037548).

BACKGROUND

1. Field

Embodiments of the inventive concepts relate to an electronic device including a two-dimensional electron gas and a method of fabricating the same and, more particularly, to an electronic device including a two-dimensional electron gas defined between binary oxides and a method of fabricating the same.

2. Description of the Related Art

A two-dimensional electron gas means an electron gas that moves freely in two dimensions. The two-dimensional electron gas has quantized energy levels. Various electronic devices have been developed using the quantized energy level characteristic of the two-dimensional electron gas.

For example, Korean Patent Publication No. 10-2012-0064182 (Application No. 10-2010-0125288, Applicant: Samsung Electro-Mechanics Co., Ltd.) discloses a nitride-based semiconductor device that has an epitaxial growth layer in order to operate at a low turn-on voltage and in order to increase withstand voltage in a reverse operation. The epitaxial growth layer is disposed on a base substrate, and the two-dimensional electron gas is generated in the epitaxial growth layer.

A GaN or $SrTiO_3$ crystalline substrate is used to form the two-dimensional electron gas. However, the GaN or $SrTiO_3$ crystalline substrate is expensive, and it is difficult to form a two-dimensional electron gas layer having a large area by using the GaN or $SrTiO_3$ crystalline substrate. In other words, it is difficult to form an inexpensive and large-area two-dimensional electron gas layer by using the GaN or $SrTiO_3$ crystalline substrate.

SUMMARY

Embodiments of the inventive concepts may provide an electronic device including a highly reliable two-dimensional electron gas and a method of fabricating the same.

Embodiments of the inventive concepts may also provide an electronic device including a two-dimensional electron gas, which is capable of simplifying fabrication processes and of reducing a fabrication cost, and a method of fabricating the same.

Embodiments of the inventive concepts may further provide an electronic device including a two-dimensional electron gas, which is capable of realizing a large area, and a method of fabricating the same.

In an aspect, an electronic device may include a silicon substrate, a first material layer disposed on the silicon substrate and formed of a binary amorphous metal oxide, a second material layer disposed on the first material layer and formed of a binary amorphous metal oxide different from the first material layer, and a first two-dimensional electron gas generated between the first material layer and the second material layer.

In some embodiments, the electronic device may further include a silicon oxide layer disposed between the silicon substrate and the first material layer so as to be in direct contact with the first material layer.

In some embodiments, each of the first material layer and the second material layer may be provided in plurality. The plurality of first material layers and the plurality of second material layers may be alternately and repeatedly stacked. The first two-dimensional electron gas may include a plurality of two-dimensional electron gases provided between the first material layers and the second material layers.

In some embodiments, the electronic device may further include a third material layer disposed on the second material layer and formed of a binary oxide different from the first material layer and the second material layer, and a second two-dimensional electron gas defined between the second material layer and the third material layer.

In some embodiments, the first material layer may include one of titanium (Ti), zinc (Zn), aluminum (Al), hafnium (Hf), and zirconium (Zr), and the second material layer may include another of titanium (Ti), zinc (Zn), aluminum (Al), hafnium (Hf), and zirconium (Zr).

In an aspect, an electronic device may include a silicon substrate, a first material layer disposed on the silicon substrate and formed of a binary amorphous metal oxide, the first material layer having a thickness of 2.5 nm or more, a second material layer disposed on the first material layer and formed of a binary amorphous metal oxide different from the first material layer, and a two-dimensional electron gas generated between the first material layer and the second material layer.

In an aspect, an electronic device may include a substrate, a first material layer disposed on the substrate and formed of a binary oxide, a second material layer disposed on the first material layer and formed of a binary oxide, and a two-dimensional electron gas generated between the first material layer and the second material layer.

In some embodiments, the first material layer and the second material layer may be formed of binary oxides different from each other.

In some embodiments, the first material layer and the second material layer may be amorphous.

In some embodiments, the first material layer may be formed of a binary amorphous metal oxide, and the second material layer may be formed of a binary amorphous metal oxide.

In some embodiments, a thickness of the first material layer may be 2.5 nm or more.

In some embodiments, the electronic device may further include an insulating layer disposed between the substrate and the first material layer. The substrate may include a silicon substrate, and the insulating layer may include silicon oxide.

In some embodiments, the first material layer and the second material layer may be formed by an atomic layer deposition (ALD) method.

BRIEF DESCRIPTION OF THE DRAWINGS

FIG. 1 is a view illustrating an electronic device including a two-dimensional electron gas, according to a first embodiment of the inventive concepts.

FIG. 2 is a flow chart illustrating a method of fabricating the electronic device including the two-dimensional electron gas, according to the first embodiment of the inventive concepts.

FIGS. 3 and 4 are cross-sectional views illustrating the method of fabricating the electronic device including the two-dimensional electron gas, according to the first embodiment of the inventive concepts.

FIG. 5 is a view illustrating an electronic device including a two-dimensional electron gas and a method of fabricating the same, according to a modified example of the first embodiment of the inventive concepts.

FIG. 6 is a view illustrating an electronic device including a two-dimensional electron gas and a method of fabricating the same, according to a second embodiment of the inventive concepts.

FIG. 7 is a view illustrating an electronic device including a two-dimensional electron gas and a method of fabricating the same, according to a third embodiment of the inventive concepts.

FIG. 8 is a view illustrating an electronic device including a two-dimensional electron gas and a method of fabricating the same, according to a fourth embodiment of the inventive concepts.

FIG. 9 is a view illustrating an electronic device including a two-dimensional electron gas and a method of fabricating the same, according to a fifth embodiment of the inventive concepts.

FIGS. 10 and 11 are graphs illustrating sheet resistances measured while varying a thickness of a material layer included in an electronic device having a two-dimensional electron gas according to some embodiments of the inventive concepts.

DETAILED DESCRIPTION OF THE EMBODIMENTS

The inventive concepts will now be described more fully hereinafter with reference to the accompanying drawings, in which exemplary embodiments of the inventive concepts are shown. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts.

It will be understood that when an element such as a layer, region or substrate is referred to as being "on" another element, it can be directly on the other element or intervening elements may be present. In addition, in the drawings, the thicknesses of layers and regions are exaggerated for clarity.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. As used herein, the term "and/or" includes any and all combinations of one or more of the associated listed items.

The terminology used herein is for the purpose of describing particular embodiments only and is not intended to limit the invention. As used herein, the singular terms "a", "an" and "the" are intended to include the plural forms as well, unless the context clearly indicates otherwise. It will be further understood that the terms "comprises", "comprising", "includes", "including", "have", "has" and/or "having" when used herein, specify the presence of stated features, integers, steps, operations, elements, and/or components, but do not preclude the presence or addition of one or more other features, integers, steps, operations, elements, components, and/or groups thereof. Furthermore, it will be understood that when an element is referred to as being "connected" or "coupled" to another element, it may be directly connected or coupled to the other element or intervening elements may be present.

In addition, in explanation of the present invention, the descriptions to the elements and functions of related arts may be omitted if they obscure the subjects of the inventive concepts.

FIG. 1 is a view illustrating an electronic device including a two-dimensional electron gas, according to a first embodiment of the inventive concepts.

Referring to FIG. 1, an electronic device including a two-dimensional electron gas according to a first embodiment of the inventive concepts may include a substrate 100, a first material layer 110, a second material layer 120, and a two-dimensional electron gas 115.

The substrate 100 may be a semiconductor substrate. According to some embodiments, the substrate 100 may be a silicon substrate. According to other embodiments, the substrate 100 may be a compound semiconductor substrate. According to still other embodiments, the substrate 100 may be a glass substrate or a plastic substrate. The substrate 100 may be flexible.

An insulating layer 105 may be disposed on the substrate 100. When the substrate 100 is a silicon substrate, the insulating layer 105 may include silicon oxide. In this case, the insulating layer 105 may be a natural oxide layer of the substrate 100, a thermal oxide layer of the substrate 100, or a silicon oxide layer deposited on the substrate 100. Unlike FIG. 1, the insulating layer 105 may be omitted.

The first material layer 110 may be disposed on the substrate 100. In some embodiments, a thickness of the first material layer 110 may be 2.5 nm or more. The first material layer 110 may be formed of a binary oxide. In some embodiments, the first material layer 110 may be in an amorphous state.

In other words, the first material layer 110 may be formed of an amorphous compound of oxygen and a first element different from oxygen. The first element may be a metal. Thus, the first material layer 110 may be formed of a binary amorphous metal oxide. For example, the first element included in the first material layer 110 may include titanium (Ti), zinc (Zn), aluminum (Al), hafnium (Hf), or zirconium (Zr). In more detail, the first material layer 110 may include titanium oxide (e.g., $TiO_2$), zinc oxide (e.g., ZnO), aluminum oxide (e.g., $Al_2O_3$), hafnium oxide (e.g., HfO), or zirconium oxide (e.g., ZrO).

The second material layer 120 may be disposed on the first material layer 110. The second material layer 120 may be formed of a binary oxide. In some embodiments, the second material layer 120 may be in an amorphous state.

In other words, the second material layer 120 may be formed of an amorphous compound of oxygen and a second element different from oxygen. The second element may be a metal. Thus, the second material layer 120 may be formed of a binary amorphous metal oxide. The second element included in the second material layer 120 may be different from the first element included in the first material layer 110. For example, when the first element included in the first material layer 110 includes one of titanium (Ti), zinc (Zn), aluminum (Al), hafnium (Hf), and zirconium (Zr), the second element included in the second material layer 120 may include another of titanium (Ti), zinc (Zn), aluminum (Al), hafnium (Hf), and zirconium (Zr). In more detail, when the first material layer 110 is formed of one of titanium oxide (e.g., $TiO_2$), zinc oxide (e.g., ZnO), aluminum oxide (e.g., $Al_2O_3$), hafnium oxide (e.g., HfO), and zirconium oxide (e.g., ZrO), the second material layer 120 may be formed of another of titanium oxide (e.g., $TiO_2$), zinc oxide (e.g., ZnO), aluminum oxide (e.g., $Al_2O_3$), hafnium oxide (e.g., HfO), and zirconium oxide (e.g., ZrO). For example, in some embodiments, when the first material layer 110 is formed of one of $TiO_2$ and $Al_2O_3$, the second material layer 120 may be formed of the other of $TiO_2$ and $Al_2O_3$.

The two-dimensional electron gas 115 may be generated between the first material layer 110 and the second material layer 120. The two-dimensional electron gas 115 may be generated between the first material layer 110 and the second material layer 120 which are formed of binary amorphous oxides different from each other. When the thickness of the first material layer 110 and/or the second material layer 120 is smaller than 2.5 nm, the two-dimensional electron gas 115 may not be generated. Thus, the thickness of the first material layer 110 and/or the second material layer 120 may be 2.5 nm or more. As a result, the two-dimensional electron gas 115 may be easily generated.

A first electrode 132 and a second electrode 134 may be provided to penetrate the second material layer 120 and the first material layer 110. The first electrode 132 and the second electrode 134 may be formed of a conductive material (e.g., a metal). A portion of the first electrode 132 and a portion of the second electrode 134 may be in direct contact with and/or connected to the two-dimensional electron gas 115.

According to some embodiments of the inventive concepts, the two-dimensional electron gas 115 may be generated between the first and second material layers 110 and 120 respectively formed of the binary oxides on the substrate 100. Thus, even though a single-crystalline substrate of GaN or $SrTiO_3$ is not used but a common silicon substrate is used, the two-dimensional electron gas 115 may be easily generated. As a result, fabrication processes may be simplified to reduce a fabrication cost. In addition, it is possible to provide the electronic device including the two-dimensional electron gas which is easy to have a large area.

A method of fabricating the electronic device including the two-dimensional electron gas according to the first embodiment of the inventive concepts will be described hereinafter.

FIG. 2 is a flow chart illustrating a method of fabricating the electronic device including the two-dimensional electron gas, according to the first embodiment of the inventive concepts. FIGS. 3 and 4 are cross-sectional views illustrating the method of fabricating the electronic device including the two-dimensional electron gas, according to the first embodiment of the inventive concepts.

Referring to FIGS. 2 and 3, a substrate 100 is prepared (S110). The substrate 100 may be a semiconductor substrate, a glass substrate, or a plastic substrate, as described with reference to FIG. 1.

An insulating layer 105 may be formed on the substrate 100. The substrate 100 may be naturally oxidized to form the insulating layer 105. In other embodiments, the insulating layer 105 may be a thermal oxide layer formed by thermally treating the substrate 100. In still other embodiments, the insulating layer 105 may be an oxide layer formed by a deposition method such as a chemical vapor deposition (CVD) method. Unlike FIG. 3, the insulating layer 105 may be omitted.

A first material layer 110 formed of a binary oxide may be formed on the substrate 100 (S120). In some embodiments, the first material layer 110 may be formed by an atomic layer deposition (ALD) method using a source including a first element and a source including oxygen. The first material layer 110 may be formed of a binary amorphous oxide of the first element and oxygen, as described with reference to FIG. 1. The first element may be a metal, as described with reference to FIG. 1.

Referring to FIGS. 2 and 4, a second material layer 120 formed of a binary oxide may be formed on the first material layer 110, and thus a two-dimensional electron gas 115 may be generated between the first material layer 110 and the second material layer 120 (S130). The second material layer 120 may be formed by an ALD method using a source including a second element different from the first element and a source including oxygen. The second material layer 120 may be formed of a binary amorphous oxide of the second element and oxygen, as described with reference to FIG. 1. The second element may be a metal, as described with reference to FIG. 1.

Referring again to FIG. 1, the second material layer 120 and the first material layer 110 may be sequentially patterned to form openings exposing the insulating layer 105, and a first electrode 132 and a second electrode 134 may be formed to fill the openings.

According to a modified example of the first embodiment of the inventive concepts, electrodes may be disposed on a first material layer, unlike the electronic device including the two-dimensional electron gas and the method of fabricating the same according to the first embodiment of the inventive concepts described above. This will be described with reference to FIG. 5.

FIG. 5 is a view illustrating an electronic device including a two-dimensional electron gas and a method of fabricating the same, according to a modified example of the first embodiment of the inventive concepts.

Referring to FIG. 5, the substrate 100, the insulating layer 105, the first material layer 110, the two-dimensional electron gas 115 and the second material layer 120, described with reference to FIGS. 1 to 4, may be provided.

A first electrode 136 and a second electrode 138 may penetrate the second material layer 120 and may be provided on a top surface of the first material layer 110. The first electrode 136 and the second electrode 138 may be formed of a conductive material (e.g., a metal). A portion of the first electrode 136 and a portion of the second electrode 138 may be in direct contact with and/or connected to the two-dimensional electron gas 115.

Similarly to the method described with reference to FIGS. 2 to 4, openings penetrating the second material layer 120 may be formed after the formation of the second material layer 120, and the first and second electrodes 136 and 138 may be formed to fill the openings, respectively.

According to a second embodiment of the inventive concepts, a plurality of material layers may be provided on a substrate and a plurality of two-dimensional electron gases may be provided between the plurality of material layers, unlike the electronic devices including the two-dimensional electron gas and the method of fabricating the same according to the first embodiment and the modified example of the inventive concepts described above. This will be described with reference to FIG. 6.

FIG. 6 is a view illustrating an electronic device including a two-dimensional electron gas and a method of fabricating the same, according to a second embodiment of the inventive concepts.

Referring to FIG. 6, the substrate 100 and the insulating layer 105 described with reference to FIGS. 1 to 4 may be provided.

First material layers 110*a* and second material layers 120*a* may be alternately and repeatedly stacked on the substrate 100. Each of the first material layers 110*a* may be formed of a binary amorphous oxide, like the first material layer 110 described with reference to FIG. 1. Each of the second material layers 120*a* may be formed of a binary amorphous oxide different from the first material layers 110*a*, like the second material layer 120 described with reference to FIG. 1.

In some embodiments, thicknesses of the first material layers 110*a* may be substantially equal to each other, and thicknesses of the second material layers 120*a* may be substantially equal to each other. Alternatively, in other embodiments, the thickness of the first material layer 110*a* and/or the second material layer 120*a* relatively close to the substrate 100 may be different from the thickness of the first material layer 110*a* and/or the second material layer 120*a* relatively far away from the substrate 100.

Formation of the first material layers 110*a* and the second material layers 120*a* alternately and repeatedly stacked may include repeatedly performing a unit process a plurality of times. Here, the unit process may include the process of forming the first material layer 110 and the process of forming the second material layer 120, described with reference to FIGS. 2 to 4.

A plurality of two-dimensional electron gases 115*a* may be provided or generated between the first material layers 110*a* and the second material layers 120*a*. The plurality of two-dimensional electron gases 115*a* may be provided to correspond to two-dimensional planes parallel to each other.

A first electrode 142 and a second electrode 144 may be provided to penetrate the first material layers 110*a* and the second material layers 120*a* which are alternately stacked. The first electrode 142 and the second electrode 144 may be formed of a conductive material (e.g., a metal). A portion of the first electrode 142 and a portion of the second electrode 144 may be in direct contact with and/or connected to the two-dimensional electron gases 115*a*.

According to a third embodiment of the inventive concepts, three different kinds of material layers may be stacked on a substrate and a plurality of two-dimensional electron gases may be provided between the material layers, unlike the electronic device including the two-dimensional electron gas according to the second embodiment of the inventive concepts described above. This will be described with reference to FIG. 7.

FIG. 7 is a view illustrating an electronic device including a two-dimensional electron gas and a method of fabricating the same, according to a third embodiment of the inventive concepts.

Referring to FIG. 7, the substrate 100 and the insulating layer 105 described with reference to FIGS. 1 to 4 may be provided.

A first material layer 110, a second material layer 120 and a third material layer 150 may be sequentially stacked on the substrate 100. The first material layer 110 may be formed of a binary amorphous oxide, as described with reference to FIG. 1. The second material layer 120 may be formed of a binary amorphous oxide different from the first material layer 110, as described with reference to FIG. 1. The third material layer 150 may be formed of a binary amorphous oxide different from the first material layer 110 and the second material layer 120. For example, when the first material layer 110 is formed of one of titanium oxide (e.g., $TiO_2$), zinc oxide (e.g., ZnO), aluminum oxide (e.g., $Al_2O_3$), hafnium oxide (e.g., HfO) and zirconium oxide (e.g., ZrO) and the second material layer 120 is formed of another of titanium oxide (e.g., $TiO_2$), zinc oxide (e.g., ZnO), aluminum oxide (e.g., $Al_2O_3$), hafnium oxide (e.g., HfO) and zirconium oxide (e.g., ZrO), the third material layer 150 may be formed of still another of titanium oxide (e.g., $TiO_2$), zinc oxide (e.g., ZnO), aluminum oxide (e.g., $Al_2O_3$), hafnium oxide (e.g., HfO) and zirconium oxide (e.g., ZrO).

A first two-dimensional electron gas 115 may be generated between the first material layer 110 and the second material layer 120, and a second two-dimensional electron gas 116 may be generated between the second material layer 120 and the third material layer 150.

In FIG. 7, the first to third material layers 110, 120, and 150 different from each other are stacked on the substrate 100. However, embodiments of the inventive concepts are not limited thereto. In certain embodiments, four or more material layers different from each other may be stacked on the substrate 100.

In addition, even though not shown in FIG. 7, electrodes may be provided on the substrate 100 to penetrate the first to third material layers 110, 120, and 150. The electrodes may be in contact with and/or connected to at least one of the first two-dimensional electron gas 115 or the second two-dimensional electron gas 116.

Unlike the first and second embodiments of the inventive concepts described above, a two-dimensional electron gas may be disposed three-dimensionally. These will be described with reference to FIGS. 8 and 9.

FIG. 8 is a view illustrating an electronic device including a two-dimensional electron gas and a method of fabricating the same, according to a fourth embodiment of the inventive concepts.

Referring to FIG. 8, an electronic device including a two-dimensional electron gas according to a fourth embodiment of the inventive concepts may include a substrate 200, a first material layer 210, a second material layer 220, and a two-dimensional electron gas 215.

The substrate 200 may be formed of the same material as the substrate 100 described with reference to FIG. 1, and the first material layer 210 and the second material layer 220 may be formed of the same materials as the first material layer 110 and the second material layer 120 described with reference to FIG. 1, respectively.

The first material layer 210 and the second material layer 220 may have an uneven structure having a concave portion and a convex portion. A top surface of the convex portion may be disposed at a higher level than a top surface of the concave portion with respect to the substrate 200.

The two-dimensional electron gas 215 may be provided between the first material layer 210 and the second material layer 220. The two-dimensional electron gas 215 may have an uneven structure having a concave portion and a convex portion along a profile of an interface between the first material layer 210 and the second material layer 220. In other words, unlike the two-dimensional electron gases according to the first to third embodiments described above, the two-dimensional electron gas 215 may include a first region provided at a plane disposed at a relatively low level parallel to the substrate 200, a second region provided at a plane not parallel to the substrate 200, and a third region disposed at a relatively high level parallel to the substrate 200.

An insulating layer 205 may be provided between the substrate 200 and the first material layer 210. The insulating layer 205 may be formed of the same material as the insulating layer 105 described with reference to FIG. 1. The insulating layer 205 may have an uneven structure having a concave portion and a convex portion. Unlike FIG. 8, the insulating layer 205 may be omitted.

Formation of the first material layer 210, the two-dimensional electron gas 215, and the second material layer 220 having the uneven structures may include forming the insulating layer 205 having the uneven structure and sequentially forming the first material layer 210 and the second material layer 220 on the insulating layer 205.

The first material layer 210 and the second material layer 220 may be formed of binary oxides (in particular, binary amorphous oxides). Thus, as described above, the first material layer 210 and the second material layer 220 may be substantially conformally formed on the insulating layer 205 having the uneven structure having the concave portion and the convex portion. As a result, the two-dimensional electron gas 215 having the concave portion and the convex portion may be easily formed.

In FIG. 8, one two-dimensional electron gas is provided. However, embodiments of the inventive concepts are not limited thereto. In certain embodiments, two or more two-dimensional electron gases having uneven structures may be provided on the substrate 200.

FIG. 9 is a view illustrating an electronic device including a two-dimensional electron gas and a method of fabricating the same, according to a fifth embodiment of the inventive concepts.

Referring to FIG. 9, an electronic device including a two-dimensional electron gas according to a fifth embodiment of the inventive concepts may include a support structure 202, first material layers 210*a*, second material layers 220*a*, and two-dimensional electron gases 215*a*.

The support structure 202 may be formed of an insulating material. Alternatively, the support structure 202 may be formed of a semiconductor material. The support structure 202 may have a rod shape extending in one direction. A cross section of the support structure 202 may have a circular shape or an elliptical shape.

The first material layers 210*a* and the second material layers 220*a* may conformally cover an outer surface of the support structure 202 and may be alternately and repeatedly stacked on the outer surface of the support structure 202. Each of the first material layers 210*a* and each of the second material layers 220*a* may be formed of the same materials as the first material layer 110 and the second material layer 120 described with reference to FIG. 1, respectively. Each of the first and second material layers 210*a* and 220*a* may have a cylindrical shape. A cross section of each of the first and second material layers 210*a* and 220*a* may have a doughnut shape.

The two-dimensional electron gases 215*a* may be provided between the first material layers 210*a* and the second material layers 220*a*. Each of the two-dimensional electron gases 215*a* may have a cylindrical shape. Each of the two-dimensional electron gases 215*a* may have a doughnut shape. A diameter of the two-dimensional electron gas 215*a* relatively close to the support structure 202 may be smaller than a diameter of the two-dimensional electron gas 215*a* relatively far away from the support structure 202.

The first material layers 210*a* and the second material layers 220*a* may be formed of binary oxides (in particular, binary amorphous oxides). Thus, as described above, the first material layers 210*a* and the second material layers 220*a* may be substantially conformally formed on the support structure 202 having the rod shape extending in one direction. As a result, the two-dimensional electron gases 215*a* having the cylindrical shapes may be easily formed.

In FIG. 9, the number of the two-dimensional electron gases is two. However, embodiments of the inventive concepts are not limited thereto. In certain embodiments, one or three or more two-dimensional electron gases having cylindrical shapes may be provided.

Characteristic evaluation according to the thicknesses of the material layers included in the electronic device having the two-dimensional electron gas according to the aforementioned embodiments of the inventive concepts will be described hereinafter.

FIGS. 10 and 11 are graphs illustrating sheet resistances measured while varying a thickness of a material layer included in an electronic device having a two-dimensional electron gas according to some embodiments of the inventive concepts.

Referring to FIG. 10, a silicon oxide layer was formed on a silicon substrate. A $TiO_2$ layer used as the first material layer was deposited on the silicon oxide layer by an ALD method. An $Al_2O_3$ layer used as the second material layer was deposited on the $TiO_2$ layer by an ALD method. A sheet resistance was measured while varying a thickness of the $TiO_2$ layer used as the first material layer. As a result, the sheet resistance when the thickness of the $TiO_2$ layer is 3 nm is much lower than the sheet resistance when the thickness of the $TiO_2$ layer is 2 nm. In addition, the sheet resistance when the thickness of the $TiO_2$ layer is 3 nm is much lower than the sheet resistance when the $Al_2O_3$ layer used as the second material layer is omitted. In other words, when the thickness of the $TiO_2$ layer used as the first material layer is 3 nm or more, the two-dimensional electron gas is formed between the $TiO_2$ layer and the $Al_2O_3$ layer.

Referring to FIG. 11, a silicon oxide layer was formed on a silicon substrate. An $Al_2O_3$ layer used as the first material layer was deposited on the silicon oxide layer by an ALD method, and a $TiO_2$ layer used as the second material layer was deposited on the $Al_2O_3$ layer by an ALD method. A sheet resistance was measured while varying a thickness of the $TiO_2$ layer used as the second material layer. As a result, the sheet resistance is significantly reduced when the thickness of the $TiO_2$ layer is about 2.5 nm or more. In other words, when the thickness of the $TiO_2$ layer used as the second material layer is 2.5 nm or more, the two-dimensional electron gas is formed between the $TiO_2$ layer and the $Al_2O_3$ layer.

The electronic device having the two-dimensional electron gas according to embodiments of the inventive concepts may be used in various fields such as a high electron mobility transistor, a memory device, a logic device, and a sensor.

According to embodiments of the inventive concepts, the electronic device including the two-dimensional electron gas may include the first and second material layers respectively formed of the binary oxides and the two-dimensional electron gas generated between the first and second material layers. Thus, fabrication processes may be simplified to reduce a fabrication cost. In addition, it is possible to provide the electronic device including the two-dimensional electron gas which is easy to have a large area.

While the inventive concepts have been described with reference to exemplary embodiments, it will be apparent to those skilled in the art that various changes and modifications may be made without departing from the spirits and scopes of the inventive concepts. For example, the electronic device including the two-dimensional electron gas according to the aforementioned embodiments of the inventive concepts may be used in various devices such as a (thin film) transistor, a memory device, a logic device, and a sensor. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An electronic device comprising:

a silicon substrate;

a silicon oxide layer disposed on the silicon substrate;

a first material layer disposed on, and in direct contact with, the silicon oxide layer, such that the silicon oxide layer is positioned between the silicon substrate and the first material layer, the first material layer formed of a first binary amorphous metal oxide;

a second material layer disposed on, and in direct contact with, a surface of the first material layer, the second material layer comprising amorphous aluminum oxide, which is a different material than the first binary amorphous metal oxide, the second material layer disposed such that the amorphous aluminum oxide is separated from the silicon oxide layer by the intervening first material layer;

a two-dimensional electron gas generated between the first material layer and the second material layer; and an electrode that is in direct contact with the surface of the first material layer, that penetrates the second material layer, and that contacts the two-dimensional electron gas.

2. The electronic device of claim 1, wherein each of the first material layer and the second material layer are provided in plurality, wherein the plurality of first material layers and the plurality of second material layers are alternately and repeatedly stacked, and wherein the device includes a plurality of two-dimensional electron gases provided between the first material layers and the second material layers.

3. The electronic device of claim 1, further comprising:

a third material layer disposed on the second material layer, the third material layer formed of a third binary amorphous metal oxide that comprises a material that is different from both the first binary amorphous metal oxide and the amorphous aluminum oxide; and a second two-dimensional electron gas defined between the second material layer and the third material layer.

4. The electronic device of claim 1, wherein the first material layer comprises titanium oxide.

5. An electronic device comprising:

a substrate;

a silicon oxide layer disposed on the substrate;

a first material layer disposed on, and in direct contact with, the silicon oxide layer, the first material layer formed of a first binary amorphous oxide and having a thickness between 2.5 nm and 5.0 nm;

a second material layer disposed on, and in direct contact with, a surface of the first material layer, the second material layer formed of a second binary amorphous oxide, wherein the first and second binary amorphous oxides are different materials;

a two-dimensional electron gas generated between the first material layer and the second material layer; and an electrode that is in direct contact with the surface of the first material layer, that penetrates the second material layer, and that contacts the two-dimensional electron gas.

6. The electronic device of claim 5, wherein the first and second binary amorphous oxides are metal oxides.

7. The electronic device of claim 5, wherein the first material layer comprises titanium oxide, and wherein the second material layer is selected from a group consisting of zinc (Zn), aluminum (Al), hafnium (Hf), and zirconium (Zr).

8. The electronic device of claim 5, wherein the substrate includes a silicon substrate.

9. The electronic device of claim 5, wherein the first material layer and the second material layer are formed by an atomic layer deposition (ALD) method.

10. The electronic device of claim 5, further comprising:

a third material layer disposed on the second material layer, the third material layer formed of a third binary amorphous oxide that comprises a material that is different from both the first binary amorphous oxide and the second binary amorphous oxide; and a second two-dimensional electron gas defined between the second binary amorphous oxide and the third binary amorphous oxide.

11. The electronic device of claim 5, wherein the second material layer is selected from a group consisting of zinc (Zn), aluminum (Al), hafnium (Hf), and zirconium (Zr).

* * * * *